(12) United States Patent
Zug et al.

(10) Patent No.: US 12,181,193 B2
(45) Date of Patent: Dec. 31, 2024

(54) VAPOR CYCLE COOLING SYSTEM FOR HIGH POWERED DEVICES

(71) Applicant: Honeywell International Inc., Charlotte, NC (US)

(72) Inventors: Andrew Zug, Costa Mesa, CA (US); Jeffrey Troester, Granger, IN (US)

(73) Assignee: Honeywell International Inc., Charlotte, NC (US)

( * ) Notice: Subject to any disclaimer, the term of this patent is extended or adjusted under 35 U.S.C. 154(b) by 596 days.

(21) Appl. No.: 17/445,226

(22) Filed: Aug. 17, 2021

(65) Prior Publication Data

US 2022/0057127 A1 Feb. 24, 2022

Related U.S. Application Data

(60) Provisional application No. 63/067,761, filed on Aug. 19, 2020.

(51) Int. Cl.

| | |
|---|---|
| *F25B 49/02* | (2006.01) |
| *F25B 41/325* | (2021.01) |
| *H01S 3/04* | (2006.01) |
| *H05K 7/20* | (2006.01) |

(52) U.S. Cl.
CPC .......... *F25B 49/022* (2013.01); *F25B 41/325* (2021.01); *H01S 3/0407* (2013.01); *H05K 7/20318* (2013.01); *F25B 2400/0409* (2013.01); *F25B 2600/0251* (2013.01)

(58) Field of Classification Search
CPC .............. F25B 49/022; F25B 2700/191; F25B 2400/0409; F25B 2600/0251; F25B 2700/1933; F25B 2700/197; F25B 2700/21151; F25B 2700/21174; F25B 5/04; F25B 41/39; F25B 49/02
See application file for complete search history.

(56) References Cited

U.S. PATENT DOCUMENTS

| | | | |
|---|---|---|---|
| 10,584,903 B2 | 3/2020 | Rockenfeller et al. | |
| 10,584,944 B2 | 3/2020 | Rockenfeller et al. | |
| 2014/0196489 A1 | 7/2014 | Emo et al. | |
| 2015/0059367 A1 | 3/2015 | Emo et al. | |

(Continued)

FOREIGN PATENT DOCUMENTS

| | | | |
|---|---|---|---|
| CN | 105428971 A | * | 3/2016 |
| CN | 106324957 A | * | 1/2017 |

(Continued)

OTHER PUBLICATIONS

Office Action from counterpart Israeli Application No. 285724 dated Nov. 30, 2023, 3 pp.

(Continued)

*Primary Examiner* — Kun Kai Ma
(74) *Attorney, Agent, or Firm* — Shumaker & Sieffert, P.A.

(57) ABSTRACT

A vapor-compression system includes a centrifugal compressor configured to increase a pressure of a refrigerant based on at least one of an activation of a device or the device being equal to or above a first threshold temperature. A fluid communication system is configured to provide, to the device, a portion of the refrigerant in a liquid state. The portion of the liquid refrigerant in a liquid state is configured to have a saturation temperature equal to or below the first temperature threshold.

20 Claims, 4 Drawing Sheets

(56) References Cited

U.S. PATENT DOCUMENTS

2019/0056154 A1     2/2019   Jansen et al.
2021/0088266 A1     3/2021   Abdoli et al.

FOREIGN PATENT DOCUMENTS

| EP | 2468944 A1 * | 6/2012 | ........... D06F 58/206 |
|---|---|---|---|
| EP | 2634509 A1 | 9/2013 | |
| WO | WO-2015186257 A1 * | 12/2015 | ............ F21V 29/503 |
| WO | 2016168569 A1 | 10/2016 | |

OTHER PUBLICATIONS

Response to Rule 62a(1) EPC dated Dec. 16, 2021, from counterpart European Application No. 21192255.4, filed Jan. 25, 2022, 2 pp.

Extended Search Report from counterpart European Application No. 21192255.4 dated Mar. 2, 2022, 10 pp.

Response to Extended Search Report dated Mar. 2, 2022, from counterpart European Application No. 21192255.4 filed Apr. 25, 2022, 41 pp.

Response to Office Action dated Nov. 30, 2023, from counterpart Israeli Application No. 285724 filed Apr. 9, 2024, 7 pp.

Communication pursuant to Article 94(3) EPC from counterpart European Application No. 21192255.4 dated Jun. 26, 2024, 5 pp.

Response to Communication pursuant to Article 94(3) EPC dated Jun. 26, 2024, from counterpart European Application No. 21192255.4 filed Aug. 8, 2024, 37 pp.

* cited by examiner

VAPOR CYCLE COOLING SYSTEM FOR HIGH POWERED DEVICES

This application claims the benefit of U.S. Provisional Patent Application 63/067,761, filed 19 Aug. 2020, the entire content of which is incorporated herein by reference.

TECHNICAL FIELD

The disclosure relates to vapor cycle cooling.

BACKGROUND

A vapor cooling system cools a device and/or components of a device. A vapor cooling system compresses and condenses the refrigerant from a relatively low-pressure vapor to a relatively high pressure liquid, which then expands and evaporates to remove heat from a fresh air stream and/or a liquid.

SUMMARY

In one example, this disclosure describes a vapor-compression system including: a centrifugal compressor configured to increase a pressure of a refrigerant based on at least one of an activation of a device or the device being equal to or above a first threshold temperature; and a fluid communication system configured to provide, to the device, a portion of the refrigerant in a liquid state, wherein the portion of the liquid refrigerant in a liquid state is configured to have a saturation temperature equal to or below the first temperature threshold.

In another example, this disclosure describes a method of cooling a device, the method including: increasing, via a centrifugal compressor, a pressure of a refrigerant upon at least one of an activation of a device or the device being equal to or above a first threshold temperature; and providing, via a fluid communication system, a portion of the refrigerant in a liquid state to the device, wherein the portion of the liquid refrigerant in the liquid state has a saturation temperature equal to or below the first temperature threshold.

In another example, this disclosure describes a vapor-compression system including: a centrifugal compressor configured to increase a pressure of a refrigerant based on at least one of an activation of a device or the device being equal to or above a first threshold temperature; a condenser in fluid communication with the centrifugal compressor and configured to remove heat and condense at least a portion of the refrigerant to a liquid state; an expansion valve in fluid communication with the condenser and configured to decrease a pressure of the refrigerant; and a fluid communication system configured to provide, to the device, the portion of the refrigerant in the liquid state, wherein the portion of the liquid refrigerant in a liquid state is configured to have a first saturation temperature equal to or below the first temperature threshold, wherein the fluid communication system is further configured to provide a second portion of the refrigerant in a liquid state to a thermal capacitor downstream from the device, wherein the second portion of the refrigerant in the liquid state has a second saturation temperature equal to or below the first saturation temperature, wherein the centrifugal compressor is further configured to shut off based on at least one of the device being deactivated or the device being equal to or below a second threshold temperature.

The details of one or more examples are set forth in the accompanying drawings and the description below. Other features, objects, and advantages will be apparent from the description and drawings, and from the claims.

DETAILED DESCRIPTION

Figure 1:
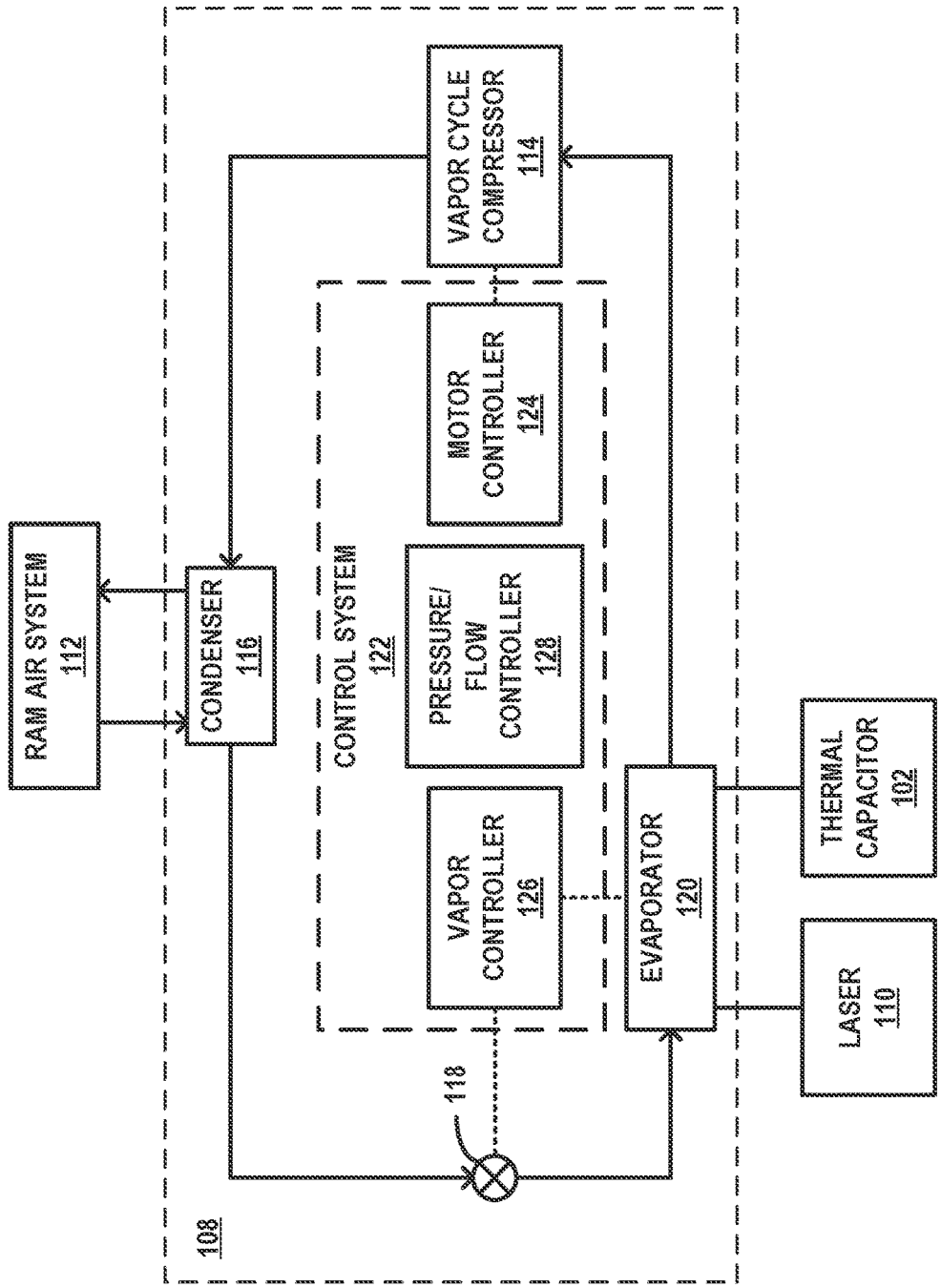
FIG. 1 is a block diagram illustrating an example system for cooling a device that includes a vapor-compression system (VCS).

High-powered devices, such as directed energy devices and lasers, require thermal management in order to operate. High-powered devices may remain at a relatively low temperature when off or when powered on but may quickly transition to a relatively high temperature while operating and/or activated. High-powered devices may generate a significant amount of heat in a short period of time when operating and/or activated, e.g., outputting energy. If not cooled, a high-powered device may only be able to operate for a relatively short period of time, e.g., a few seconds or less, and the device-generated heat may cause failure of the device and/or components of the device.

Some cooling systems for high-powered devices utilize the thermal capacitance of a material to cool and/or maintain a temperature of the device and/or device components to less than a threshold temperature for at least a period of time, e.g., to extend the period of time the device may be activated for beyond the relatively short period of time before the device reaches a threshold temperature at which the device ceases operating to prevent device and/or component failure. For example, some systems may use a large mass of a liquid such as water or a tank of ammonia or phase change materials to dump heat from the device to. Some systems may alternatively or additionally use a vapor-compression system (VCS) to cool a fluid of an intermediate fluid loop configured to remove heat from the device via flowing liquid/fluid cooling. For example, a laser may output energy to be focused on a target for a period of time, generating heat which may be transferred to a thermal capacitor, such as a mass of a liquid, until the thermal capacitance of the mass of liquid corresponding to a threshold temperature is reached. The laser must then stop outputting energy and generating heat, while the laser and/or laser components and the thermal capacitor are cooled down. Such systems require significant mass, both for the thermal capacitor, e.g., the fluid of the intermediate fluid loop, and associated intermediate fluid loop components such as pumps and fluid conduit, in order to provide cooling for the high-powered device.

There are a wide range of performance and cooling capacities for VCSs, which vary depending on the compressor technology used. For example, positive displacement compressors work with a constant flow regardless of outlet pressure. Dynamic compressors, such as high-speed centrifugal compressors, work at a constant pressure and may be affected by external conditions, such as changes in inlet temperatures. Generally, dynamic compression technologies are best suited for higher flows and relatively less varying heat loads, and positive displacement technologies are better suited for variable loads, such as some directed energy devices such as lasers. However, positive displacement technologies are heavy and require oil.

In some applications, such as on an aircraft, positive displacement technologies for VCS cooling may be disadvantageous relative to dynamic compression technologies because of size, weight, and power (SWaP) differences between the two technology types. For example, a VCS utilizing a high-speed centrifugal compressor may have a reduced size and weight relative to a VCS utilizing a positive displacement compressor. However, a VCS utilizing a high-speed centrifugal compressor may also have a narrow range of operation relative to a positive displacement-type VCS. For example, if a heat load requires 2 kilowatts (kW) of cooling, a centrifugal-type VCS sized for 6 kW of cooling may suffer a significant drop in efficiency, e.g., leading to a relatively large power consumption relative to the cooling provided. Additionally, a centrifugal-type VCS may have limitations on downscaling the size the VCS system. For example, a centrifugal compressor for a VCS having a cooling capacity of less than 40 kW may be difficult and/or impossible to manufacture.

In some examples, the present disclosure describes systems and processes for providing a refrigerant of a VCS including a centrifugal compressor directly to a high-powered device to cool the device. The refrigerant may be liquid, vapor or gas, or a mixture of the two, e.g., at various positions within the VCS loop. For example, a system may be configured to directly provide cooled liquid refrigerant to the high-powered device without an intermediate fluid loop and/or thermal capacitor, thereby reducing the weight and volume of the cooling system. Additionally, the systems and processes described may include a relatively small and lightweight VCS, e.g., equal to or less than 40 kW, with an efficient and relatively light weight centrifugal compressor used in combination with a cycling scheme for cooling a variable heat load that may produce a large amount of heat in a relatively short amount of time, rather than an inherently heavier positive displacement compressor-based VCS that is typically used for variable heat loads. In some examples, the systems and techniques described include a low-pressure refrigerant, such as R1233zd, R236fa, or R245fa, or a similar low-pressure refrigerants, which may enable the use of a relatively larger and manufacturable centrifugal compressor. For example, a low-pressure refrigerant may need to be pressurized by a compressor to a "high pressure" that is relatively lower than a non-low-pressure refrigerant, enabling the use of a centrifugal compressor configured to operate with a larger impeller and/or rotor operating at a relatively lower speed, relative to an impeller speed for compressing a non-low-pressure refrigerant.

In some examples, elimination of the intermediate loop and fluid allows for a larger VCS and also enables direct transfer of heat from the device to the refrigerant, both of which may enable faster cooling of the device. In some examples, a VCS may utilize a variable speed centrifugal compressor and may cycle cooling via the VCS to manage operation of the VCS to cool the high-powered device, which may enable the high-powered device to operate longer before one or more components reach a critical temperature requiring the device to cease outputting energy.

FIG. 1 is a block diagram illustrating an example system 100 for providing cooling that includes a vapor-compression system (VCS) 108. The cooling may be used to cool air (conditioned air), a fluid, a thermal capacitor, or as in the example shown, laser 110 and thermal capacitor 102. Laser 110 may be a directed energy device, and may be a heat load that generates significant heat in a short period of time when activated and a small amount of heat when deactivated, e.g., such as when laser 110 is powered on and ready to receive commands, but not firing and/or outputting directed energy. Thermal capacitor 102 may be any or all of another device, electronics, a battery, air, fluid, a thermal capacitor, another laser, a cold plate, or any suitable material that may be cooled.

In the example shown, laser 110 and thermal capacitor 102 are a first heat load and a second heat load, respectively. In some examples, system 100 may include a single heat load, e.g., laser 110, or a plurality of heat loads as shown, and VCS 108 may be configured to provide cooling to a single heat load or a plurality of heat loads. In other words, although described in the context of laser 110 and thermal capacitor 102, the techniques of this disclosure are not so limited, and a person skilled in the art will understand that the systems described herein may be employed in a variety of contexts without departing from structures and mechanics described herein.

VCS 108 includes a vapor cycle compressor (VCC) 114, a condenser 116, an expansion device 118 (e.g., an expansion valve), and an evaporator 120 fluidically coupled to each other through pressurized refrigerant supply lines to form a refrigerant circuit. A variety of refrigerants may be used in VCS 108.

VCC 114 may be configured to receive vapor refrigerant from evaporator 120 and compress and pump vapor refrigerant to condenser 116. VCC 114 may include a centrifugal compressor configured to receive the vapor refrigerant at an inlet pressure and discharge the vapor refrigerant at a higher outlet pressure. VCC 114 may include one or more compression stages and a motor, which may be an electrically driven motor. The motor may be configured to receive electrical power, such as from a motor controller 124, and generate mechanical power to drive the one or more compression stages. Condenser 116 may be configured to receive superheated vapor refrigerant from VCC 114, condense the vapor refrigerant, and discharge subcooled refrigerant to an expansion device 118. Condenser 116 may be cooled by environmental air, such as ram-air flow, from a ram-air system 112, or another fluid such as fuel or heat transport fluids.

Expansion device 118 may be configured to control flow of refrigerant to evaporator 120 and reduce a pressure of liquid refrigerant prior to entry into evaporator 120. Expansion device 118 may be an orifice, tube, metered valve, or other device configured to reduce a pressure of a liquid refrigerant.

Evaporator 120 may be configured to receive cabin pressure air, such as from an air supply system 102, remove heat from cabin air using a refrigerant, and discharge cabin air to cabin/avionics 110. On a refrigerant side, evaporator 120 may be configured to receive saturated refrigerant, absorb heat from a heat load, e.g., laser 110 and/or thermal capacitor 102, and vaporize the refrigerant, and discharge superheated vapor refrigerant.

In some examples, evaporator 120 may be in thermal contact with one or both heat loads laser 110 and thermal capacitor 102. For example, evaporator 120 may comprise and/or include a cold plate in thermal contact with both laser 110 and thermal capacitor 102. In some examples, VCS 108 may include multiple evaporators 120 each thermally coupled to a heat load, e.g., a first evaporator 120 thermally coupled to laser 110 and a second evaporator thermally coupled to thermal capacitor 102. In some examples, a heat load may be evaporator 120. For example, evaporator 120 may not be a separate device and/or material in thermal contact with a heat load, but may rather be the heat load itself configured to be in thermal contact with the refrigerant. For example, laser 110 and/or thermal capacitor 102 may be configured to be in thermal contact with the refrigerant and to conduct or otherwise transfer heat to the refrigerant. In some examples, laser 110 and/or thermal capacitor 102 may be configured with refrigerant lines and may conduct or otherwise transfer heat to the refrigerant through the refrigerant lines.

System 100 includes a control system 122 for controlling various conditions of VCS 108, such as refrigerant flow rate, refrigerant vapor composition, refrigerant temperature, and the like. Control system 122 may be configured to monitor and/or operate one or more process control components of system 100. For example, control system 122 may be communicatively coupled to any of thermal capacitor 102, ram-air system 112, VCC 114, expansion device 118, or any other component of system 100. Control system 122 may also be communicatively coupled to instrumentation, such as flow meters, temperature sensors, and pressure sensors, and configured to receive measurement signals from the instrumentation. For example, control system 122 may be configured to receive measurement signals for various parameters of VCS 108, such as a speed of VCC 114, temperature of laser 110 and/or thermal capacitor 102, or a superheat of vapor refrigerant entering VCC 114, determine a mismatch between the measurement signals and a setpoint for the corresponding parameter, and send a control signal to one or more components of system 100 to reduce the mismatch and return the parameter to within the setpoint. Control system 122 may include any of a wide range of devices, including processors (e.g., one or more microprocessors, one or more application specific integrated circuits (ASICs), one or more field programmable gate arrays (FPGAs), or the like), processing circuitry, servers, desktop computers, notebook (i.e., laptop) computers, tablet computers, and the like.

Control system 122 may include a motor controller 124 configured to control a motor of VCC 114. As discussed above, a motor may provide mechanical power to one or more impellers of VCC 114, and therefore modulate flow rate of refrigerant through VCS 108. The speed of VCC 114 may correspond to various temperature setpoints of VCS 108, such as cooling demands of evaporator 120, laser 110, and/or thermal capacitor 102 and inlet superheat of the vapor refrigerant into VCC 114. To control a speed of VCC 114, motor controller 124 may be configured to send control signals to VCC 114 to control an amount of electrical power to the motor of VCC 114, such as from an APU or other power supply. Control system 122 may include a vapor controller 126 configured to control a vapor composition of the refrigerant in VCS 108. To control a vapor composition of the refrigerant, vapor controller 126 may be configured to send control signals to expansion device 118 and/or evaporator 120 to control a position of expansion device 118 and/or a position of a bypass valve of evaporator 120, such as by closing expansion device 118 to increase a superheat of the refrigerant entering VCC 114. Control system 122 may include a pressure/flow controller 128 configured to control ram-air system 112 in order to receive a particular flow of supply air from ram-air system 112.

According to the examples disclosed herein, VCS 108 may include a centrifugal compressor configured to increase the pressure of a refrigerant based on at least one of an activation of a device or the device being equal to or above a first threshold temperature. For example, control system 122 may be configured to activate VCS 108 to provide cooling based on activation, e.g., firing, or laser 110 or a temperature of laser 110 being equal to or above a first threshold temperature. VCS 108 may further include a fluid communication system configured to provide liquid refrigerant having a saturation temperature equal to or below the first temperature threshold to the device. VCS 108 may include one or more refrigerant fluid lines configured to provide cooled liquid refrigerant having a saturation temperature equal to or below the first threshold temperature, e.g., downstream of expansion valve 118, to laser 110 and/or thermal capacitor 102.

In some examples, the centrifugal compressor may be further configured to shut off based on at least one of the device being deactivated or equal to or below a second threshold temperature. For example, the operation of heat loads such as laser 110 may be sensitive to temperature, and VCS 108 may be configured to regulate the temperature of the heat load to a certain temperature range.

By way of an illustrative example, laser 110 may be configured to operate optimally between 20 C (e.g., degrees Celsius) and 30 C. The first temperature threshold may be 25 C. As such, controller 122 may be configured to activate VCC 114 and VCS 108 to provide cooling to laser 110 if the temperature of laser 110 reaches 25 C or greater, regardless of whether laser 110 is activated and firing. In this way, laser 110 may be kept in the lower portion of its optimal temperature range, e.g., to extend the time laser 110 may be activated before reaching its maximum optimal temperature. In some examples, laser 110 may be expected to generate significant heat in a short amount of time, and controller 122 may be configured to activate VCC 114 and VCS 108 to provide cooling to laser 110 if laser 110 is activated, regardless of whether the temperature of laser 110 is equal to or greater than the first threshold temperature, e.g., controller 122 need not wait until laser 110 heats up to the first threshold temperature before providing cooling so as to extend the time laser 110 may be activated before reaching its maximum optimal temperature.

Continuing with the illustrative example, controller 122 may be configured to deactivate, or shut off, VCC 114 and VCS 108 in order to cease provide cooling to laser 110 based on laser 110 being deactivated or equal to or below the second threshold temperature. For example, if laser 110 is currently activated (e.g., firing) and has a temperature that decreases (e.g., due to VCS 108 cooling and perhaps additional environmental conditions) to equal to or below the second threshold temperature, e.g., 20 C, controller 122 may be configured to shut off VCS 108. The operation of laser 110, e.g., either its output or the conditions of the components of laser 110 may require its temperature to be above the second threshold temperature in order to operate and/or optimally operate. In some examples, the second threshold temperature may not be the same as the lower limit of operation of laser 110, e.g., the second threshold temperature may be 21 C or greater. If laser 110 is not currently activated, and VCS 108 is activated to provide cooling to laser 110, e.g., the temperature of laser 110 may be equal to or greater than 25 C (the first temperature threshold), controller 122 may be configured to shut off VCS 108 when the temperature of laser 110 is equal to or less than the second threshold temperature.

Figure 2:
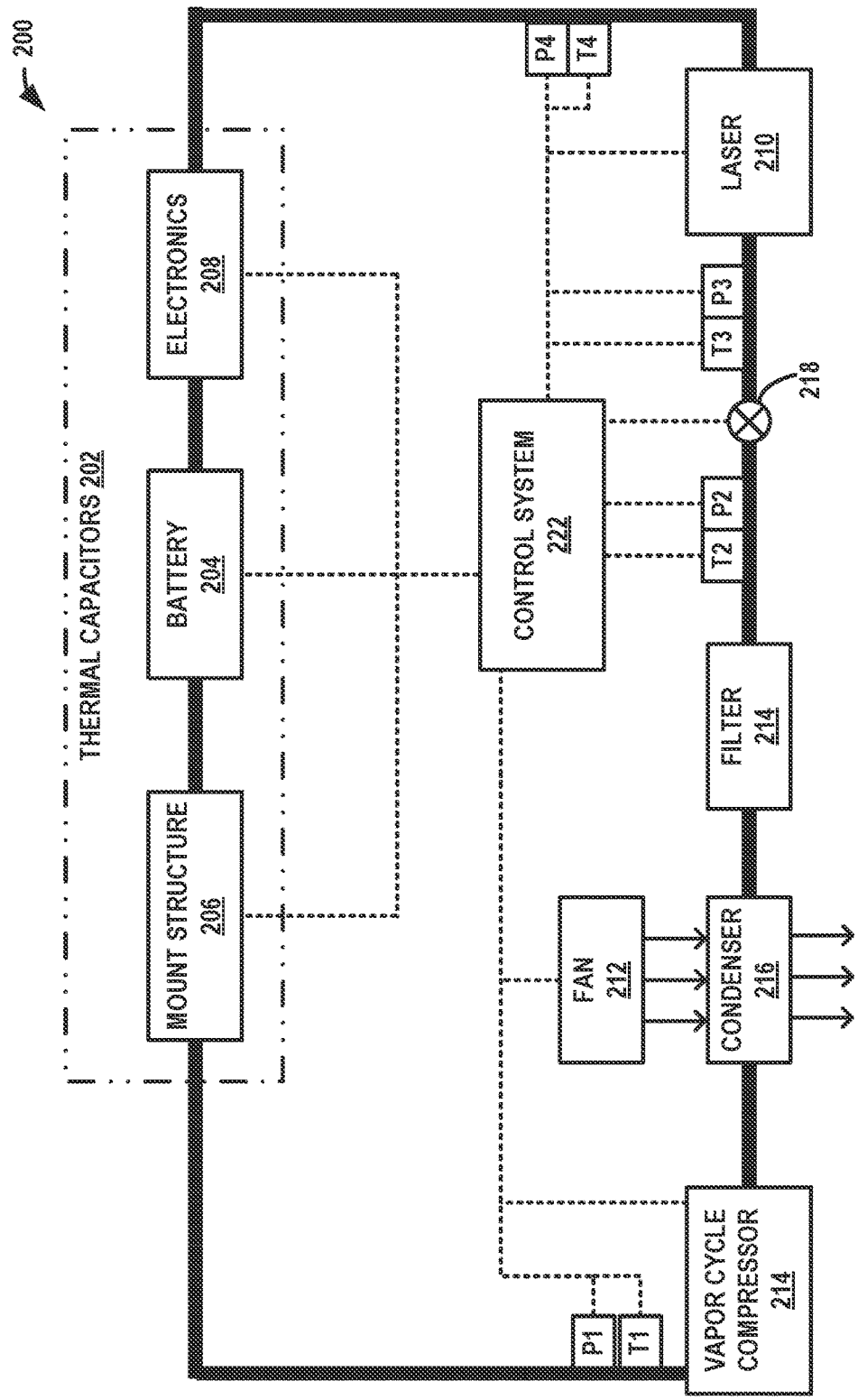
FIG. 2 is a block diagram illustrating another example system for cooling a device that includes a centrifugal compressor-based VCS.

FIG. 2 is a block diagram illustrating another example system 200 for providing cooling that includes a centrifugal compressor-based VCS. In some examples, system 200 may be another example of system 100 described above, and further illustrates additional components such as pressure and temperature sensors. In some examples, system 200 is distinct from system 100. In the example shown, the cooling is used to cool a device, e.g., laser 210. Laser 210 may be substantially similar to laser 110 described above, and may operate in a substantially similar manner to laser 110. Laser 210 may be a directed energy device, and may be a heat load that generates significant heat in a short period of time when activated and a small amount of heat when deactivated, e.g., such as when laser 210 is powered on and ready to receive commands, but not firing and/or outputting directed energy. In the example shown, system 200 includes VCC 214, condenser 216, expansion device 218, laser 210, thermal capacitors 202, and control system 222, each of which may be, and operate, substantially similar to VCC 114, condenser 116, expansion device 118, laser 110, thermal capacitor 102, and control system 122 described above. In the example described below, system 200 may implement one or more example cycling schemes in which one or more components of the VCS are activated and/or deactivated based on the temperature and activation status of laser 210.

Control system 222 is configured to receive information and/or data, such as temperature and pressure data, of various components of system 200, e.g., VCC 214, laser 210, thermal capacitors 202, as well as the refrigerant at various positions of the cycle, e.g., T1-T3 and P1-P3. Control system 222 is configured to control the speed of VCC 214 based on received information so as to compress low pressure refrigerant vapor at the inlet of VCC 214 having a first pressure and temperature, measured by sensors P1, T1, to a higher pressure at the outlet of VCC 214. System 200 may use a variety of refrigerants. For example, system 200 may use R1233zd, R236fa, or R245fa, or a similar low-pressure refrigerants, other non-low-pressure refrigerants, or any suitable refrigerant or two-phase fluid. VCC 214 may include one or more compression stages and a motor, which may be an electrically driven motor configured to receive electrical power and generate mechanical power to drive the one or more compression stages. In some examples, VCC 214 may be a high speed and/or variable speed centrifugal compressor, and VCC 214 may include an electrical feedback loop configured to enable variable speed control of the compressor motor of VCC 214. Control system 222 may be configured to control the motor to drive the one or more compression stages, e.g., based on received information.

Control system 222 is configured to control (e.g., cause) VCC 214 is compress and pump vapor refrigerant to condenser 216. Condenser 216 may be configured to receive superheated vapor refrigerant from VCC 214, condense the vapor refrigerant, and discharge subcooled liquid refrigerant to an expansion device 218. Fan 212 may be configured to supply environmental air and/or other fluid such as fuel or heat transport fluids to condenser 216 to remove heat from the refrigerant. Control system 222 may be configured to cause fan 212 to move an amount of fluid to condenser 216, e.g., via controlling fan speed. In some examples, Fan 212 may be a RAM-air system, and control system 222 may be configured to control the amount and/or rate of air and/or fluid provided to condenser 216 to remove heat from the refrigerant and condense the refrigerant.

In the example shown, system 200 includes a filter-drier 214 downstream of condenser 216 and upstream of expansion device 218 and/or laser 210. In some examples, filter-drier 214 may be optional and system 200 may not include filter-drier 214. In other examples, system 200 may include a plurality of filter-driers 214 located at similar or different portions of the VCS flow path, e.g., between condenser 216 and expansion device 218, and/or between expansion device 218 and laser 210, and/or between laser 210 and thermal capacitors 202, and/or between thermal capacitors 202 and VCC 214, and or between VCC 214 and condenser 216.

Expansion device 218 may be configured to control flow of refrigerant to laser 210 and reduce a pressure of saturated refrigerant prior to entry into laser 210, (e.g., expansion device 218 may be an expansion valve). Expansion device 218 may be an orifice, tube, metered valve, or other device configured to reduce a pressure of a saturated refrigerant. In some examples, expansion device 218 may include feedback. Feedback may include a temperature and/or pressure sensor configured to measure the temperature and/or pressure of refrigerant before expansion device 218 (e.g., T2, P2), after expansion by expansion device 218 (e.g., T3, P3), and/or after exiting laser 210. In some examples, the expansion device 218 may reduce the pressure of saturated refrigerant at least partially determined based on the temperature and/or pressure measured via feedback. For example, control system 222 may be configured to control expansion device 218 based on the temperature and/or pressure of the liquid refrigerant, e.g., any or all of T1-T4 and P1-P4. Control system 222 may be configured to change and/or vary the expansion of the refrigerant, e.g., the pressure drop of the refrigerant, provided by expansion device 218 to control at least the temperature T3 of the liquid portion of the refrigerant, or the saturation temperature of the liquid portion of the refrigerant, to be within a target range. For example, control system 222 may control expansion device 218 based on T1-T4 and/or P1-P4 to expand the refrigerant provided to laser 210 to have a saturation temperature of equal to greater than 20 C and less than or equal to 25 C, or equal to greater than 20 C and less than or equal to 22 C, or equal to greater than 20 C and less than or equal to 21 C, or any suitable range of saturation temperatures.

Laser 210 is configured to receive the refrigerant from expansion device 218. Laser 210 may be, or act as, the evaporator of system 200, and may be substantially the same as evaporator 220 described above. Laser 210 may include one or more fluid flow paths configured to transport the refrigerant of system 200. Laser 210 may be configured to transfer heat to the refrigerant, causing at least a portion of the liquid portion of the refrigerant to vaporize, e.g., boil.

By way of example, control system 222 may receive a temperature measurement of laser 210 of 23 C, e.g., from an internal temperature sensor of laser 210, while laser 210 is operating but not activated or firing. Control system 222 may be configured to deactivate an/or keep VCC 214, fan 212, and/or other components of the system 200 deactivated, e.g., not to provide cooling to laser 210. Laser 210 may then be activated, and control system 222 may receive information that laser 210 is firing, e.g., from laser 210 and/or a laser 210 controller (not shown). Control system 222 may then cause VCC 214, fan 212, and/or other components of the system 200 to activate to provide cooling to laser 210. For example, control system 222 may control the saturation temperature of the liquid portion of the refrigerant provided from expansion device 218 to laser 210 to be about 20 C. At least a portion of the liquid portion of the refrigerant then absorbs heat from laser 210, which is at 23 C at the start of activation, and vaporizes. The cooling provided to laser 210 by the refrigerant, e.g., amount of heat absorbed by the liquid portion of the refrigerant from laser 210, may extend the amount of time that it takes laser 210 to increase from 23

C to 30 C when firing, thereby extending the activation time of laser 210. At 30 C, laser 210 may then deactivate due to reaching a high temperature threshold. Control system 210 may be configured to continue providing cooling to laser 210, e.g., controlling the various components of the VCS including VCC 214, fan 212, and expansion valve 218 with or without feedback or temperature and/or pressure information from T1-T4 and P1-P4 of the refrigerant and laser 210, VCC 214, or other VCS components, to provide refrigerant with a saturation temperature of 20 C to laser 210 while laser 210 is deactivated to cool laser 210. Control system 222 may receive temperature information from laser 210, and may be configured to deactivate the various VCS components, e.g., VCC 214, fan 212, and expansion valve 218, to cease providing cooling to laser 210 if the temperature of laser 210 is equal to or below 20 C.

In the example shown, thermal capacitors 202 are configured to receive refrigerant from laser 210. In other words, thermal capacitors 202 are downstream from laser 210 in the flow path of the refrigerant. Thermal capacitors 202 may be configured to be in thermal contact with the refrigerant, or in thermal contract with the fluid communication system of system 200, e.g., refrigerant lines, tubes, or conduit. Thermal capacitors 202 include electronics 208, battery 204, and mount structure 206. In some examples, thermal capacitors 202 may include only one or two of electronics 208, battery 204, and mount structure 206 in any combination. In some examples, thermal capacitors 202 may include additional thermal masses, e.g., components, structures, and the like.

Electronics 208 may be electrical components or an electronic controller of laser 210, control system 222, VCC 214, a vehicle within which system 200 may be included or to which system 200 may be attached, or any suitable electronics. Battery 204 may be one or more batteries of laser 210, system 200, a vehicle within which system 200 may be included or to which system 200 may be attached, or any suitable battery. Mount structure 206 may be a mounting structure, housing, or pod of laser 210, system 200, and/or any structure or portion of a structure of a vehicle within which system 200 may be included or to which system 200 may be attached.

In the example shown, whether laser 210 is firing or deactivated, control system 222 may be configured to provide cooling to laser 210, and refrigerant may be flowing within the fluid communication system of system 200. In some examples, at least a portion of the refrigerant downstream from laser 210 may be liquid and may have a temperature and pressure T4, P4 that decreases along the fluid flow path to T1, P1 at the inlet of VCC 214. In other words, the pressure of the refrigerant within system 200 is lowest at the inlet of VCC 214, e.g., causing the refrigerant to flow to the inlet of VCC 214. As the pressure decreases, the saturation temperature of the liquid portion of the refrigerant decreases. For example, following examples described above, the liquid refrigerant may have a saturation temperature of 19 C, or 18 C or 17 C, or lower, at thermal capacitors 202, e.g., lower than the 20 C at laser 210. In some examples, system 200 may be configured to cool thermal capacitors 202 to a lower temperature than the low threshold temperature of laser 210, and thereby act as a thermal mass or thermal capacitor.

For example, control system 222 may be configured to cause VCC 214 to activate and the VCS to cause refrigerant to flow within system 200 to cool thermal capacitors to a temperature lower than the low threshold temperature of laser 210, e.g., 15 C. In other words, at thermal capacitors 202, the liquid portion of the refrigerant may have a saturation temperature of 15 C or less. If laser 210 activates, control system 222 may be configured to provide refrigerant having a saturation temperature to cool laser 210, e.g., 20 C. Laser 210 may heat rapidly and transfer heat to the refrigerant boiling a substantial portion, or all, of the liquid refrigerant, e.g., to a superheated vapor. Thermal capacitors 202 may then no longer provide heat to the refrigerant, but rather may absorb heat from the refrigerant cooling the refrigerant, which may increase the efficiency of the VCS.

In some examples, thermal capacitors 202 may increase the cooling capacity of the VCS until the thermal capacitance of the thermal capacitors 202 has been reached, e.g., they increase in temperature to a threshold temperature. For example, laser 210 may output 40 kW of heat, e.g., when firing, 40 kW of power may be converted into heating laser 210. If system 200 is configured to provide 10 kW of cooling to laser 210 via a vapor-compression cycle, and thermal capacitors 202 are cooled to below a threshold temperature, the system 200 may be configured to provide between 15 kW to 10 kW of cooling to laser 210 with the inclusion of thermal capacitors 202. In other words, system 200 may be configured to provide cooling to laser 210 with a combination of VCS cooling and thermal capacitance of thermal capacitors 202, at least up to the point that thermal capacitance of the thermal capacitors is exhausted, e.g., the temperature of thermal capacitors 202 reaches a temperature threshold. System 200, with the combination of the VCS system and thermal capacitors, may provide increased cooling capacity to laser 210 relative to the VCS system alone, and may further increase the time laser 210 may continue to fire by reducing the rate at which the temperature of laser 210 increases via the increased cooling capacity.

Further, thermal capacitors 202 may be configured to be "charged," e.g., cooled, even while laser 210 is firing. For example, if not all of the liquid refrigerant is vaporized by laser 210, the portion of liquid refrigerant flowing to thermal capacitors 202 is configured to have a saturation temperature less than the saturation temperature of the liquid refrigerant provided to laser 210, which may be a low threshold temperature of laser 210. Thermal capacitors 202 may then be configured to be cooled to less than the low temperature threshold of laser 210 even while laser 210 is firing, in addition to when laser 210 is deactivated and not firing and control system 222 causes cooling to be provided to laser 210.

In some examples, VCC 214 may be configured to increase the pressure of refrigerant, e.g., and cause the refrigerant move through the VCS system to provide cooling, based on any or all, in any combination, of the temperature of laser 210 being equal to or above a first threshold temperature, the activation of laser 210, or the temperatures of any of thermal capacitors 202 being equal to or above one or more other first threshold temperatures.

In some examples, control system 222 may be configured to activate the VCS of system 200, e.g., cause VCC 214 to increase the pressure of refrigerant and cause the refrigerant move through the system, based on any or all, in any combination, of the temperature of laser 210 being equal to or above a first threshold temperature, the activation of laser 210, or the temperatures of any of thermal capacitors 202 being equal to or above one or more other first threshold temperatures.

In some examples, VCC 214 may be configured to shut off, e.g., and cause the refrigerant to cease moving through the VCS system and ceasing providing cooling, based on any or all, in any combination, of the temperature of laser 210 being equal to or below a second threshold temperature, the deactivation of laser 210, or the temperatures of any of thermal capacitors 202 being equal to or below one or more other second threshold temperatures.

In some examples, control system 222 may be configured to deactivate the VCS of system 200, e.g., cause VCC 214 to shut off and cause the refrigerant to cease moving through the system, based on any or all, in any combination, of the temperature of laser 210 being equal to or below a second threshold temperature, the deactivation of laser 210, or the temperatures of any of thermal capacitors 202 being equal to or below one or more other second threshold temperatures.

Figure 3:
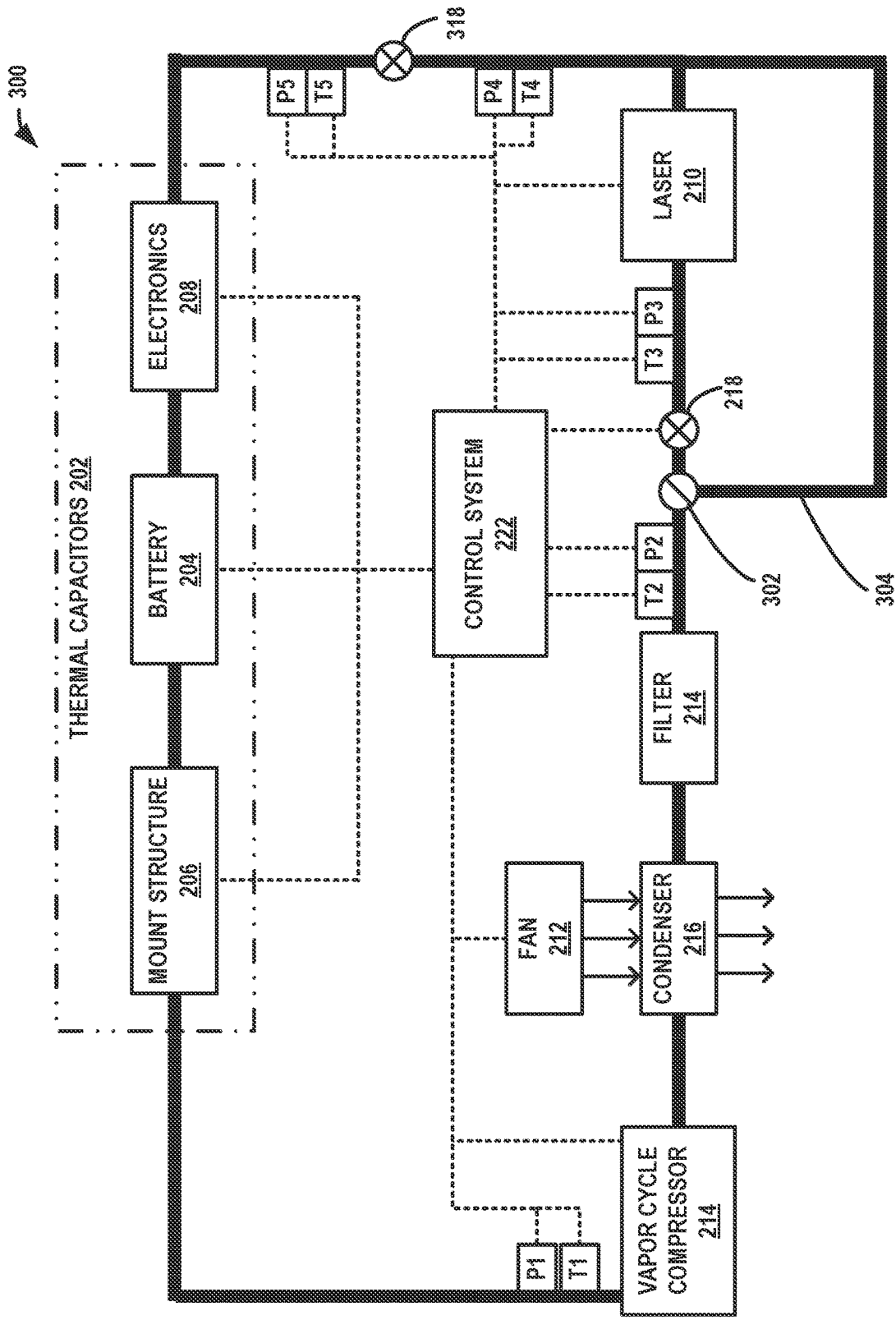
FIG. 3 is a block diagram illustrating another example system for providing cooling that includes a centrifugal compressor-based VCS.

FIG. 3 is a block diagram illustrating an example system 300 for providing cooling that includes a centrifugal compressor-based VCS. System 300 may be substantially the same as system 200 described above, with the exception that system 300 further includes a second expansion device 318 positioned downstream from laser 210 and upstream from thermal capacitors 202, system 300 may include additional temperature and pressure sensors T5, P5 located downstream from expansion device 318, and system 300 may optionally include bypass flow path 304 and bypass valve 302.

Expansion device 318 may improve the cooling for thermal capacitors 202, and may enable the elimination of a surge valve (not shown) configured to maintain a minimum volumetric flow through the inlet of VCC 214. For example, expansion device 318 may be configured to reduce the pressure of the refrigerant downstream of expansion device 218, further reducing the saturation temperature of the liquid portion of the refrigerant, e.g., relative to refrigerant upstream of expansion device 318 and downstream of expansion device 218 and thus absorbing enough heat from the thermal capacitors 202 to avoid liquid refrigerant at the inlet of VCC 214.

Additionally, system 300 may be configured to bypass expansion device 318 and laser 210, and expansion device 318 may be configured to reduce the pressure of the refrigerant, e.g., as the only expansion device of the VCS loop. For example, control system 300 may be configured to determine that laser 210 is within a temperature range for which it reduced and/or no refrigerant may be provided to laser 210, e.g., following examples described above, laser 210 may be at a temperature between 20 C and 25 C and not firing. Bypass valve 302 may be configured to reroute at least a portion of the refrigerant to bypass path 304, and control system 300 may be configured to cause bypass valve 302 to reroute a portion or all of the refrigerant to bypass path 304. Control system 222 may cause expansion device 318 to reduce the pressure of the refrigerant, received from either bypass path 304 or from laser 210, e.g., to pressure P5. The liquid portion of the refrigerant may then have a reduced saturation temperature, e.g., 10 C, and may be provided to thermal capacitors 202 to cool thermal capacitors 202.

In some examples, expansion device 318 may be configured to reduce the saturation temperature of the liquid portion of the refrigerant such that substantially all of the liquid refrigerant vaporizes via heat from thermal capacitors 202, enabling the elimination or deactivation of a surge valve (not shown) of the VCS. For example, a surge valve may be included with any of system 100-300 to prevent substantially all of the liquid portion of the refrigerant from entering the inlet of VCC 214. Expansion device 318 may be configured to reduce the saturation temperature of the liquid portion of the refrigerant provided to thermal capacitors 202 such that, in combination with the temperatures of the thermal capacitors and the amount of heat thermal capacitors are able to transfer to the refrigerant, substantially all of the liquid portion of the refrigerant is vaporized or boiled off at the inlet of VCC 214. Control system 222 may be configured to control the expansions, e.g., pressure drops, at any or all of expansion devices 218 and 318, and routing of the refrigerant through laser 210 and/or bypass path 304, based on the temperatures and pressures of the refrigerant at various positions within the VCS, e.g., T1-T5 and P1-P5, and the temperatures of laser 210 and thermal capacitors 202, to provide cooling to laser 210 and/or thermal capacitors 202, and optionally to ensure that substantially all of the refrigerant is vapor at the inlet of VCC 214.

Figure 4:
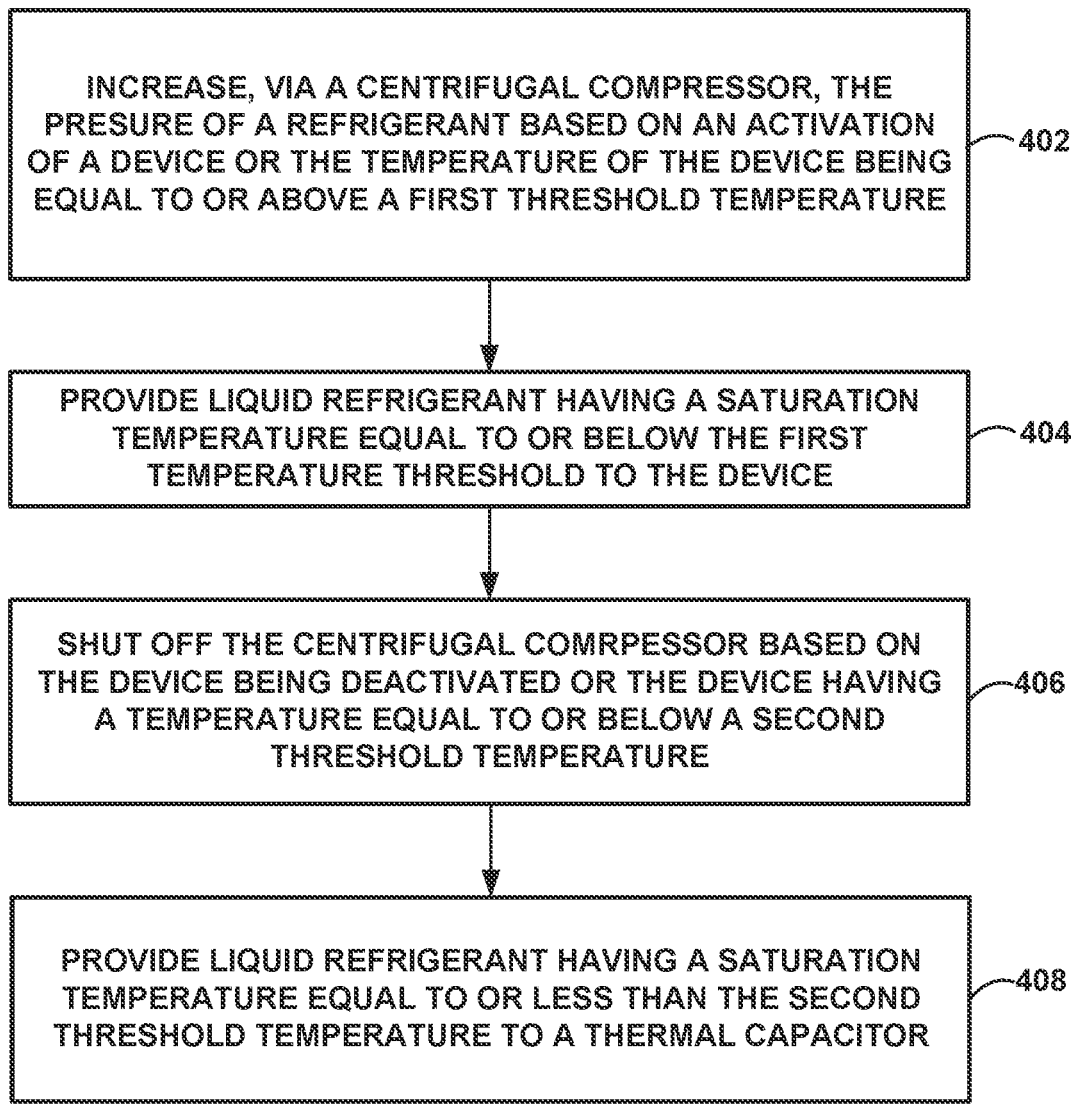
FIG. 4 is a flow diagram of an example process of cooling a device via a centrifugal compressor-based VCS.

FIG. 4 is a flow diagram of an example process of cooling a device via a centrifugal compressor-based VCS. Although the example technique of FIG. 4 is described with respect to system 300 of FIG. 3, the example technique of FIG. 4 may be performed with systems 100 and/or 200 described herein, or any VCS including a centrifugal compressor. In some examples, the technique of FIG. 4 may be performed by processing circuitry or a controller, such as control system 222 or processing circuitry of control system 222.

Control system 222 may cause VCC 214 to increase the pressure of a refrigerant upon at least one of an activation of a device (e.g., laser 210) or the device being equal to or above a first threshold temperature (402). For example, laser 210 may be powered on and operating, but not firing and/or activated. Electronics of laser 210 may convert electrical power to heat, albeit at a low rate and a low amount of heat, that raises the temperature of laser 210 relatively slowly. If the temperature of laser 210 raises to be equal to or greater than a first threshold temperature, control system 222 may cause VCC 214 to "turn on," e.g., increase the pressure of the refrigerant from the inlet to the outlet of VCC 214, and initiate the process of providing cooled liquid refrigerant to laser 210 via a VCS. In another example, if the temperature of laser 210 is below the first threshold temperature and laser 210 is activated, (e.g., by control system 222 or a separate control system, or by a user), control system 222 may cause VCC 214 to "turn on" and initiate the process of providing cooled liquid refrigerant to laser 210.

Control system 222 may cause a fluid communication system to provide a portion of the refrigerant in a liquid state to the device, the portion of the liquid refrigerant in the liquid state has a saturation temperature equal to or below the first temperature threshold (404). For example, control system 222, in addition to turning on VCC 214, may control a fan or a mass flow of a fluid in a condenser configured to cool and condense at least a portion of the pressurized refrigerant exiting VCC 214. Control system 222 may further control expansion valve 218 to reduce the pressure of the refrigerant exiting the condenser, e.g., such that a portion of the refrigerant vaporizes and a different portion of the refrigerant is liquid with a reduced saturation temperature, e.g., which may be equal to or below the first temperature threshold.

In some examples, the device, e.g., laser 210, may be a directed energy device, and may be mounted or attached to an aircraft. It may be desired to reduce and/or minimize the weight of the VCS providing cooling to laser 210, e.g., by directly providing refrigerant to laser 210 rather than cooling a medium of a second loop that may provide liquid or air cooling to laser 210 and that may also be a thermal capacitor but require additional fluid communication systems or components, and/or reducing the size of the VCS including the compressor. For example, system 300 may provide the refrigerant directly to laser 210 without an intermediate cooling loop and associated hardware/intermediate fluid communication system, and may be a VCS with a relatively small cooling capacity that may be less than the heat generated by laser 210 when activated and/or firing, e.g., to reduce the weight of the VCS. Further, VCC 214 may be a centrifugal compressor to further reduce weight, e.g., relative to a positive displacement compressor configured operate such that the VCS may provide a substantially equivalent amount of cooling.

Control system 222 may be configured operate the VCS, e.g., turn on VCC 214 and other VCS components, according to scheme based on the temperature and activation status of laser 210. In some examples, control system 222 may turn on VCC 214 such that VCC 214 may operate efficiently, e.g., at or near its designed cooling capacity. For example, laser 210 may generate, when activated, 20 kW of heat that may cause the temperature of laser 210 to rise, and the VCS including a centrifugal-type VCC 214 may provide 10 kW of cooling, e.g., which may be at or near the cooling capacity of the VCS with VCC 214 operating at or near its peak efficiency. In some examples, the VCS, when turned on by control system 222, may slow the temperature rise of laser 210 and extend the amount of time that laser 210 may be activated while having a temperature within the temperature range, or extend the amount of energy that laser 210 is able to output while having a temperature within the temperature range.

Laser 210 may be configured to operate within a temperature range, e.g., 20 C to 30 C, and control system 222 may cause VCC 214 to turn on to provide cooling to laser 210 based on at least a temperature of laser 210 or the activation status of laser 210, e.g., activated or deactivated, to control the temperature of laser 210 to be within the temperature range and/or extend a time that laser 210 is activated and within the temperature range. Laser 210 may not operate well (e.g., its output may be reduced and/or at an undesired or wrong frequency/wavelength) or may be damaged if it operates outside of the temperature range, either too hot (above 30 C), or too cold (below 20 C).

In some examples, control system 222 may cause VCC 214 to turn on to provide cooling to laser 210 to keep the temperature of laser 210 at a lower temperature end of the laser 210 temperature range, e.g., between 20 C and 25 C, which may further extend the time that laser 210 may be activated while having a temperature within its temperature range. As such, the first temperature threshold may be less than the high temperature threshold of laser 210, e.g., following the example discussed just above, the first temperature threshold may be 25 C while the high temperature threshold of laser 210 may be 30 C.

Control system 222 may cause VCC 214 to shut off based on at least one of the device being deactivated or having a temperature equal to or below a second threshold temperature (406). Continuing with the example just above, control system 222 may shut off VCC 214 and the VCS so as to cease providing cooling to laser 210 based on the temperature of laser 210 being less than or equal to 20 C, e.g., the second threshold temperature, regardless of whether laser 210 is activated or deactivated.

Control system 222 may cause the fluid communication system to provide liquid refrigerant having a saturation temperature equal to or less than the second threshold temperature to a thermal capacitor, e.g., any of thermal capacitors 202 (408). In some examples, control system 222 may be configured to, and may cause, thermal capacitors to be cooled via liquid refrigerant having a saturation temperature less than or equal to the second threshold temperature while providing liquid refrigerant having a saturation temperature equal to or greater than the second threshold temperature to the device, e.g., laser 210.

For example, as refrigerant flows through the VCS of system 300 from laser 210 to the inlet of VCC 214, the pressure of the refrigerant continues to decrease to the pressure P1 at the inlet of VCC 214. Correspondingly, the saturation temperature of the liquid portion of the refrigerant remaining after laser 210 that flows to thermal capacitors 202 decreases, enabling the liquid refrigerant to cool thermal capacitors to a temperature equal to or below the second threshold temperatures, e.g., less than 20 C, following the example above.

In some examples, system 300 includes a second expansion device 318 and control system 222 may be configured to control the saturation temperature of the liquid refrigerant provided to thermal capacitors 202 via second expansion device 318. For example, control system 222 may cause valve 302 to reroute at least a portion of the refrigerant, vapor and/or liquid, via bypass path 304 to expansion valve 318. Control system 222 may then cause expansion device 318 to reduce the pressure of the refrigerant, whether from laser 210 or bypass path 304. For example, control system 222 may cause expansion device 218 to reduce the pressure of the refrigerant such that the liquid portion of the refrigerant has a saturation temperature of about 20 C. Control system 222 may cause expansion device 318 to reduce the pressure of the refrigerant such that the remaining liquid portion of the refrigerant has a saturation temperature of about 10 C, which may then flow to thermal capacitors 202 to cool thermal capacitors 202 to less than the second threshold temperature, e.g., 10 C.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit and/or control system (e.g., control system 122, 222) including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded, at least in part, in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

The following numbered examples illustrate one or more aspects of the devices and techniques described in this disclosure.

Example 1: A vapor-compression system including: a centrifugal compressor configured to increase a pressure of a refrigerant based on at least one of an activation of a device or the device being equal to or above a first threshold temperature; and a fluid communication system configured to provide, to the device, a portion of the refrigerant in a liquid state, wherein the portion of the liquid refrigerant in a liquid state is configured to have a saturation temperature equal to or below the first temperature threshold.

Example 2: The vapor-compression system of example 1, wherein the centrifugal compressor is further configured to shut off based on at least one of the device being deactivated or the device being equal to or below a second threshold temperature.

Example 3: The vapor-compression system of example 1 or example 2, wherein the device comprises a directed energy device.

Example 4: The vapor-compression system of any one of examples 1 through 3, wherein the device is configured to output an amount of heat that is greater than a cooling capacity of the vapor-compression system when activated, wherein the device is configured to output an amount of heat that is less than the cooling capacity of the vapor-compression system when deactivated.

Example 5: The vapor-compression system of example 4, wherein the capacity of the vapor-compression system is equal to or less than 15 kilowatts.

Example 6: The vapor-compression system of any one of examples 2 through 5, wherein the fluid communication system is further configured to provide liquid refrigerant below the second threshold temperature to a thermal capacitor.

Example 7: The vapor-compression system of example 6, wherein the thermal capacitor is at least one of a battery, an electronic controller of the device, or a housing of the device.

Example 8: The vapor-compression system of any one of examples 1 through 7, further including: a first expansion valve configured to reduce a pressure of the refrigerant before the portion of the refrigerant in a liquid state is provided to the device; and a second expansion valve configured to further reduce a pressure of the refrigerant downstream from the first expansion device.

Example 9: The vapor-compression system of example 8, wherein the fluid communication system is further configured to cause at least a portion of the refrigerant to bypass the device to the second expansion valve.

Example 10: The vapor-compression system of any one of examples 1 through 9, wherein the fluid communication system is configured to provide liquid refrigerant equal to or below the first temperature threshold to the device without a surge valve.

Example 11: A method of cooling a device, the method including: increasing, via a centrifugal compressor, a pressure of a refrigerant upon at least one of an activation of a device or the device being equal to or above a first threshold temperature; and providing, via a fluid communication system, a portion of the refrigerant in a liquid state to the device, wherein the portion of the liquid refrigerant in the liquid state has a saturation temperature equal to or below the first temperature threshold.

Example 12: The method of example 11, further including: shutting off the centrifugal compressor based on at least one of the device being deactivated or equal to or below a second threshold temperature.

Example 13: The method of example 11 or example 12, wherein the device comprises a directed energy device.

Example 14: The method of any one of examples 11 through 13, wherein the device is configured to output an amount of heat that is greater than a cooling capacity of the vapor-compression system when activated, wherein the device is configured to output an amount of heat that is less than the cooling capacity of the vapor-compression system when deactivated.

Example 15: The method of example 14, wherein the capacity of the vapor-compression system is equal to or less than 15 kilowatts.

Example 16: The method of any one of examples 11 through 15, further including: providing, via the fluid communication system, the liquid refrigerant having a saturation temperature equal to or below the second threshold temperature to a thermal capacitor.

Example 17: The method of example 16, wherein the thermal capacitor is at least one of a battery, an electronic controller of the device, or a housing of the device.

Example 18: The method of any one of examples 11 through 17, further including: reducing, via a first expansion valve, a pressure of the refrigerant before the portion of the refrigerant in a liquid state is provided to the device; and reducing, via a second expansion valve, the pressure of the refrigerant downstream from the first expansion device.

Example 19: The method of claim 18, further including: causing, via the fluid communication system, at least a portion of the refrigerant to bypass the device to the second expansion valve.

Example 20: A vapor-compression system including: a centrifugal compressor configured to increase a pressure of a refrigerant based on at least one of an activation of a device or the device being equal to or above a first threshold temperature; a condenser in fluid communication with the centrifugal compressor and configured to remove heat and condense at least a portion of the refrigerant to a liquid state; an expansion valve in fluid communication with the condenser and configured to decrease a pressure of the refrigerant; and a fluid communication system configured to provide, to the device, the portion of the refrigerant in the liquid state, wherein the portion of the liquid refrigerant in a liquid state is configured to have a first saturation temperature equal to or below the first temperature threshold, wherein the fluid communication system is further configured to provide a second portion of the refrigerant in a liquid state to a thermal capacitor downstream from the device, wherein the second portion of the refrigerant in the liquid state has a second saturation temperature equal to or below the first saturation temperature, wherein the centrifugal compressor is further configured to shut off based on at least one of the device being deactivated or the device being equal to or below a second threshold temperature.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

Based upon the above discussion and illustrations, it is recognized that various modifications and changes may be made to the disclosed technology in a manner that does not necessarily require strict adherence to the examples and applications illustrated and described herein. Such modifications do not depart from the true spirit and scope of various aspects of the disclosure, including aspects set forth in the claims.

Various examples have been described. These and other examples are within the scope of the following claims.

What is claimed is:

1. A vapor-compression system comprising:
   a centrifugal compressor configured to increase a pressure of a refrigerant based on at least one of an activation of a device or a temperature of the device being equal to or above a first threshold temperature; and
   a fluid communication system configured to provide, to the device, a portion of the refrigerant in a liquid state, wherein the portion of the refrigerant in the liquid state is configured to have a saturation temperature equal to or below the first temperature threshold.

2. The vapor-compression system of claim 1, wherein the centrifugal compressor is further configured to shut off based on at least one of the device being deactivated or the temperature of the device being equal to or below a second threshold temperature.

3. The vapor-compression system of claim 1, wherein the device comprises a directed energy device.

4. The vapor-compression system of claim 1, wherein the device is configured to output an amount of heat that is greater than a cooling capacity of the vapor-compression system when activated,
   wherein the device is configured to output an amount of heat that is less than the cooling capacity of the vapor-compression system when deactivated.

5. The vapor-compression system of claim 4, wherein the cooling capacity of the vapor-compression system is equal to or less than 15 kilowatts.

6. The vapor-compression system of claim 2, wherein the fluid communication system is further configured to provide liquid refrigerant having a saturation temperature below the second threshold temperature to a thermal capacitor.

7. The vapor-compression system of claim 6, wherein the thermal capacitor is at least one of a battery, an electronic controller of the device, or a housing of the device.

8. The vapor-compression system of claim 1, further comprising:
   a first expansion valve configured to reduce a pressure of the refrigerant before the portion of the refrigerant in the liquid state is provided to the device; and
   a second expansion valve configured to further reduce a pressure of the refrigerant downstream from the first expansion valve.

9. The vapor-compression system of claim 8, wherein the fluid communication system is further configured to cause at least a portion of the refrigerant to bypass the device to the second expansion valve.

10. The vapor-compression system of claim 1, wherein the fluid communication system is configured to provide liquid refrigerant equal to or below the first temperature threshold to the device without a surge valve.

11. A method of cooling a device, the method comprising:
    increasing, via a centrifugal compressor, a pressure of a refrigerant upon at least one of an activation of a device or a temperature of the device being equal to or above a first threshold temperature; and
    providing, via a fluid communication system, a portion of the refrigerant in a liquid state to the device, wherein the portion of the refrigerant in the liquid state has a saturation temperature equal to or below the first temperature threshold.

12. The method of claim 11, further comprising:
    shutting off the centrifugal compressor based on at least one of the device being deactivated or the temperature of the device being equal to or below a second threshold temperature.

13. The method of claim 11, wherein the device comprises a directed energy device.

14. The method of claim 11, wherein the device is configured to output an amount of heat that is greater than a cooling capacity of a vapor-compression system when activated,
    wherein the device is configured to output an amount of heat that is less than the cooling capacity of the vapor-compression system when deactivated.

15. The method of claim 14, wherein the cooling capacity of the vapor-compression system is equal to or less than 15 kilowatts.

16. The method of claim 12, further comprising:
    providing, via the fluid communication system, liquid refrigerant having a saturation temperature equal to or below the second threshold temperature to a thermal capacitor.

17. The method of claim 16, wherein the thermal capacitor is at least one of a battery, an electronic controller of the device, or a housing of the device.

18. The method of claim 11, further comprising:
    reducing, via a first expansion valve, a pressure of the refrigerant before the portion of the refrigerant in the liquid state is provided to the device; and
    reducing, via a second expansion valve, the pressure of the refrigerant downstream from the first expansion valve.

19. The method of claim 18, further comprising:
    causing, via the fluid communication system, at least a portion of the refrigerant to bypass the device to the second expansion valve.

20. A vapor-compression system comprising:
    a centrifugal compressor configured to increase a pressure of a refrigerant based on at least one of an activation of a device or a temperature of the device being equal to or above a first threshold temperature;
    a condenser in fluid communication with the centrifugal compressor and configured to remove heat and condense at least a portion of the refrigerant to a liquid state;

an expansion valve in fluid communication with the condenser and configured to decrease a pressure of the refrigerant; and a fluid communication system configured to provide, to the device, the portion of the refrigerant in the liquid state, wherein the portion of the liquid refrigerant in the liquid state is configured to have a first saturation temperature equal to or below the first temperature threshold, wherein the fluid communication system is further configured to provide a second portion of the refrigerant in a liquid state to a thermal capacitor downstream from the device, wherein the second portion of the refrigerant in the liquid state has a second saturation temperature equal to or below the first saturation temperature, wherein the centrifugal compressor is further configured to shut off based on at least one of the device being deactivated or the temperature of the device being equal to or below a second threshold temperature.

* * * * *